(12) United States Patent
Shiga et al.

(10) Patent No.: US 8,094,479 B2
(45) Date of Patent: Jan. 10, 2012

(54) SEMICONDUCTOR MEMORY DEVICE

(75) Inventors: Hidehiro Shiga, Kamakura (JP);
Daisaburo Takashima, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 182 days.

(21) Appl. No.: 12/684,375

(22) Filed: Jan. 8, 2010

(65) Prior Publication Data

US 2011/0044087 A1    Feb. 24, 2011

(30) Foreign Application Priority Data

Aug. 24, 2009   (JP) .................................. 2009-193446

(51) Int. Cl.
*G11C 11/22* (2006.01)
(52) U.S. Cl. ......................................... 365/145; 365/149
(58) Field of Classification Search .................. 365/145, 365/149, 158
See application file for complete search history.

(56) References Cited

U.S. PATENT DOCUMENTS

| 5,978,251 A * | 11/1999 | Kraus et al. .................... 365/145 |
| 5,991,188 A * | 11/1999 | Chung et al. .................. 365/145 |
| 6,845,031 B2 * | 1/2005 | Kang et al. .................... 365/145 |
| 6,924,999 B2 * | 8/2005 | Masui .......................... 365/145 |

FOREIGN PATENT DOCUMENTS

JP      2000-156090       6/2000

OTHER PUBLICATIONS

Background Art Information.

* cited by examiner

*Primary Examiner* — Anh Phung
(74) *Attorney, Agent, or Firm* — Knobbe, Martens, Olson & Bear LLP

(57) ABSTRACT

A memory includes ferroelectric capacitors; sense amplifiers configured to detect the data stored in ferroelectric capacitors; and a plate control circuit configured to receive a plate driving signal driving a plate line, a write signal indicating writing of data from an outside to the sense amplifier, and an operation end signal indicating end of an executable period for reading or writing data between the sense amplifier and the outside, the plate control circuit validating or invalidating the plate driving signal based on the write signal and the operation end signal wherein the plate control circuit validates the plate driving signal in the executable period, and the plate control circuit invalidates the plate driving signal at the end of the executable period when the write signal is never activated in the executable period, and keeps the plate driving signal valid when the write signal is activated in the executable period.

9 Claims, 11 Drawing Sheets

SEMICONDUCTOR MEMORY DEVICE

CROSS-REFERENCE TO RELATED APPLICATION

This application is based upon and claims the benefit of priority from the prior Japanese Patent Applications No. 2009-193446, filed on Aug. 24, 2009, the entire contents of which are incorporated herein by reference.

BACKGROUND OF THE INVENTION

1. Field of the Invention

The present invention relates to a semiconductor memory device.

2. Related Art

A ferroelectric memory is a destructive read out memory device in which data is destroyed in a data read operation. Accordingly, after the data read operation, it is necessary to perform a restore operation for writing back data. If a sense amplifier detects data, a one-directional electric field is applied between electrodes of a ferroelectric capacitor. Therefore, in the data read operation, not both data "0" and data "1" are destroyed but one of the data is destroyed.

However, in case of a conventional ferroelectric memory device, a restore period is equally provided for each of the data "0" and the data "1" in the data read operation. In the data read operation, it suffices to restore the one destroyed data. However, in a data write operation, it is necessary to equivalently write both the data "0" and the data "1". Due to this, according to the conventional technique, the restore period is equally provided for each of the data "0" and the data "1" even in the data read operation to conform to the data write operation.

SUMMARY OF THE INVENTION

A semiconductor memory device according to an embodiment of the present invention comprises: a plurality of word lines; a plurality of bit lines intersecting the plurality of word lines; a plurality of ferroelectric capacitors corresponding to intersecting points between the word lines and the bit lines, respectively, and configured to store therein data; a plurality of plate lines connected to electrodes of the ferroelectric capacitors; a plurality of sense amplifiers connected to the bit lines, and configured to detect the data stored in the ferroelectric capacitors connected the bit lines; and a plate control circuit configured to receive a plate driving signal driving at least one of the plate lines, a write signal indicating writing of data from an outside to at least one of the sense amplifiers, and an operation end signal indicating end of an executable period for reading the data from at least one of the sense amplifiers to the outside or for writing the data from the outside to at least one of the sense amplifiers, the plate control circuit being configured to validate or invalidate the plate driving signal on the basis of the write signal and the operation end signal wherein the plate control circuit validates the plate driving signal in the executable period, and the plate control circuit invalidates the plate driving signal at the end of the executable period when the write signal is never activated in the executable period, and keeps the plate driving signal valid when the write signal is activated at least once in the executable period.

A semiconductor memory device according to an embodiment of the present invention comprises: a plurality of word lines; a plurality of bit lines intersecting the plurality of word lines; a plurality of ferroelectric capacitors corresponding to intersecting points between the word lines and the bit lines, respectively, and configured to store therein data; a plurality of plate lines connected to electrodes of the ferroelectric capacitors; a plurality of sense amplifiers connected to the bit lines, and configured to detect the data stored in the ferroelectric capacitors connected the bit lines; and a plate control circuit configured to receive a plate driving signal driving at least one of the plate lines and a read signal indicating a data read operation for reading data from at least one of the sense amplifiers to an outside, and to validate or invalidate the plate driving signal based on the read signal, wherein the plate control circuit validates the plate driving signal in an executable period for the data read operation for reading the data from at least one of the sense amplifiers to the outside or for a data write operation for writing data from the outside to at least one of the sense amplifiers, and the plate control circuit invalidates the plate driving signal when the read signal is activated, and keeps the plate driving signal valid when the read signal is not activated.

A semiconductor memory device according to an embodiment of the present invention comprises: a plurality of word lines; a plurality of bit lines intersecting the plurality of word lines; a plurality of ferroelectric capacitors corresponding to intersecting points between the word lines and the bit lines, respectively, and configured to store therein data; a plurality of plate lines connected to electrodes of the ferroelectric capacitors; a plurality of sense amplifiers connected to the bit lines, and configured to detect the data stored in the ferroelectric capacitors connected the bit lines; and a plate control circuit configured to receive a plate driving signal driving at least one of the plate lines, a read signal indicating a data read operation for reading data from at least one of the sense amplifiers to an outside, and a sense signal indicating start of an amplification operation performed by at least one of the sense amplifiers, and to validate or invalidate the plate driving signal based on the read signal and the sense signal, wherein the plate control circuit holds a state of executing the data read operation or a state of not executing the data read operation during an executable period, the executable period being for the data read operation for reading the data from at least one of the sense amplifiers to the outside or for a data write operation for writing data from the outside to at least one of the sense amplifiers, and the plate control circuit invalidates the plate driving signal when at least one of the sense amplifiers is activated if the read signal indicates the data read operation, and keeps the plate driving signal valid if the read signal does not indicate the data read operation.

DETAILED DESCRIPTION OF THE INVENTION

Embodiments of the present invention will be explained below in detail with reference to the accompanying drawings. Note that the invention is not limited thereto.

First Embodiment

Figure 1:
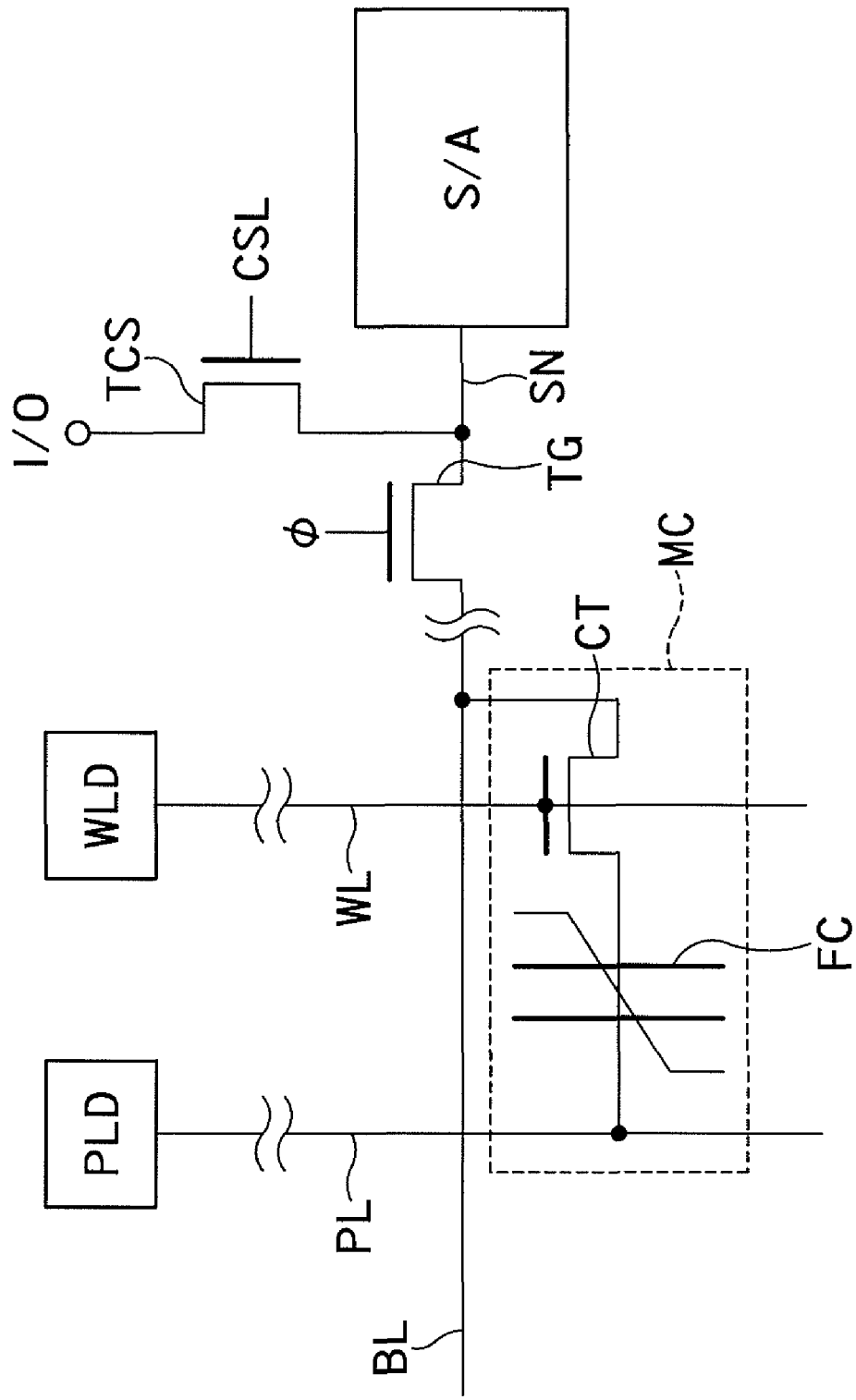
FIG. 1 is a circuit diagram showing a configuration of a ferroelectric memory device according to a first embodiment of the present invention.

FIG. 1 is a circuit diagram showing a configuration of a ferroelectric memory device according to a first embodiment of the present invention. The ferroelectric memory device according to the first embodiment includes a plurality of word lines WL extending in a row direction, a plurality of bit lines BL extending in a column direction orthogonal to the row direction, and a plurality of plate lines PL extending in the row direction. Although FIG. 1 only shows one word line WL, one bit line BL and one plate line PL, the ferroelectric memory device actually includes many word lines WL, many bit lines BL, and many plate lines PL.

One memory cell MC stores binary data or multi-bit data in a ferroelectric capacitor FC. The memory cell MC is provided to correspond to an intersecting point between one word line WL and one bit line BL. Therefore, a plurality of memory cells MC is arranged in a matrix two-dimensionally. Each word line WL is connected to a gate of a cell transistor CT arranged in the row direction or provided as a gate electrode G itself. Each bit line BL is connected to a source or a drain of the cell transistor CT arranged in the column direction. Each plate line PL is connected to an electrode of the ferroelectric capacitor FC on an opposite side to the cell transistor CT. In one memory cell MC, the cell transistor CT and the ferroelectric capacitor FC are connected in series between the bit line BL and the plate line PL.

A sense node SN of one sense amplifier S/A is connected to one end of the bit line BL via a transfer gate TG, and the sense amplifier S/A detects the data stored in the ferroelectric capacitor FC of the memory cell MC. The data detected by the sense amplifier S/A is output from an input/output circuit I/O via a column selection transistor TCS. A column selection line CSL controls the column selection transistor TCS.

A control signal Φ controls the transfer gate TG. The transfer gate TG is turned off if the sense amplifier S/A amplifies a signal difference. Due to this, a capacity of the bit line BL is not added to that of the sense node SN, the sense amplifier S/A can, therefore, easily amplify data. Further, the transfer gate TG is turned on when data is written from the sense amplifier S/A to the memory cell MC.

A word line driver WLD and a plate line driver PLD are configured to be connected to the word line WL and the plate line PL and to apply voltages to the word line WL and the plate line PL according to an operation command, respectively.

Figure 2:
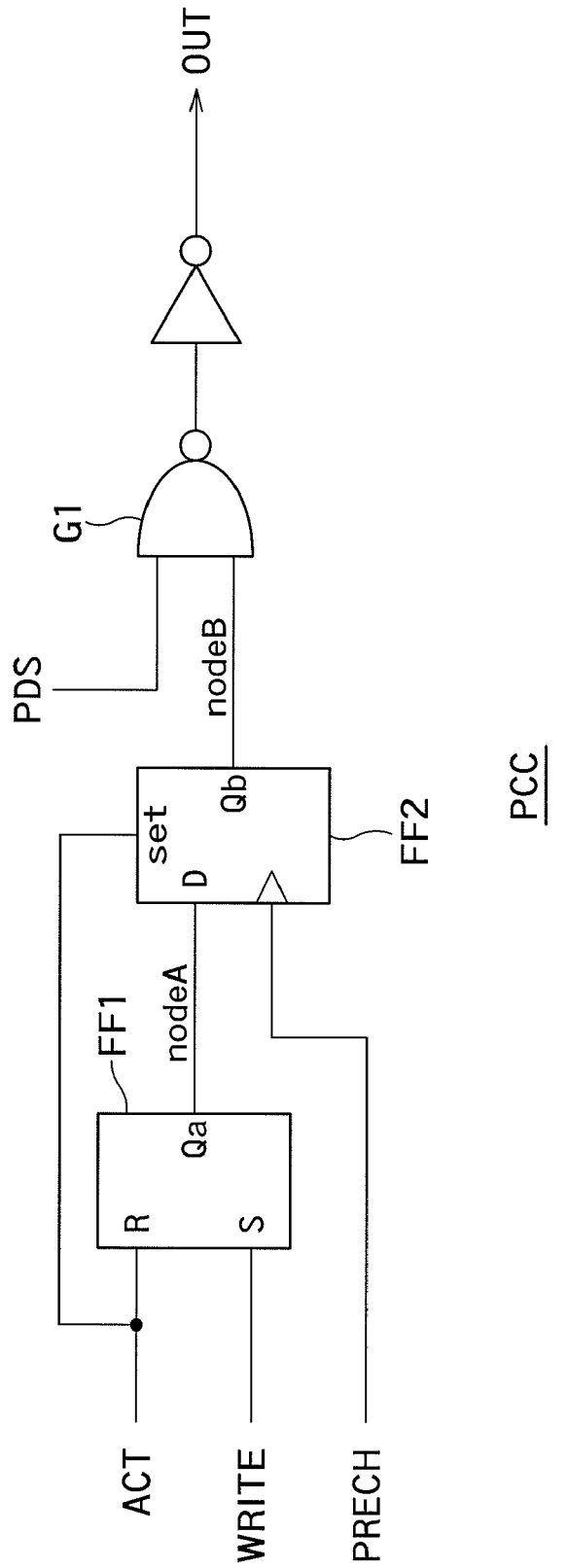
FIG. 2 is a circuit diagram showing a configuration of a plate control circuit PCC incorporated in the plate line driver PLD or attached exteriorly of the plate line driver PLD.

FIG. 2 is a circuit diagram showing a configuration of a plate control circuit PCC incorporated in the plate line driver PLD or attached exteriorly of the plate line driver PLD.

As shown in FIG. 2, the plate control circuit PCC receives a plate driving signal PDS driving the plate line PL, a write signal WRITE indicating that data is written from the outside to the sense amplifier S/A, an active signal ACT that serves as an operation start signal indicating start of an executable period for executing a data read operation for reading data from the sense amplifier S/A to the outside or a data write operation for writing data from the outside to the sense amplifier S/A (hereinafter, also simply "executable period"), and a precharge signal PRECH that serves as an operation end signal indicating end of the executable period. The plate control circuit PCC is configured to validate or invalidate the plate driving signal PDS based on the write signal WRITE, the active signal ACT and the precharge signal PRECH.

More specifically, the plate control circuit PCC is configured to include a first flip-flop FF1, a second flip-flop FF2, and a gate circuit G1. The first flip-flop FF1 is an RS flip-flop that receives the active signal ACT as a reset input, receives the write signal WRITE as a set input, and that outputs an operation flag Qa based on the active signal ACT and the write signal WRITE. If the write signal WRITE is activated to be logically high (if the data write operation is to be executed), the first flip-flop FF1 raises the operation flag Qa. The second flip-flop FF2 is a D flip-flop that receives the precharge signal PRECH and the operation flag Qa, and that outputs the operation flag Qa at a timing of activating the precharge signal PRECH as an operation flag Qb.

At this time, the second flip-flop FF2 receives the operation flag Qa from the first flip-flop FF1 as a D input. However, before the precharge signal PRECH is activated, the second flip-flop FF2 keeps the operation flag Qb in a logically high state. For convenience sake, the operation flag output from the second flip-flop FF2 is referred to as "Qb". The operation flag Qb becomes identical in logic to the operation flag Qa at the timing at which the precharge signal PRECH is activated.

The gate G1 shown in FIG. 2 is a NAND gate that receives the plate driving signal PDS and the operation flag Qb from the second flip-flop FF2, and that validates or invalidates the plate driving signal PDS according to the operation flag Qb from the second flip-flop FF2. If the operation flag Qb is active, the gate G1 validates the plate driving signal PDS. If the operation flag Qb is inactive, the gate G1 invalidates the plate driving signal PDS.

The fact that the plate driving signal PDS is valid means that the plate control circuit PCC passes the plate driving signal PDS. In this case, logic of the plate driving signal PDS is reflected in an output OUT. The fact that the plate driving signal PDS is invalid means that the plate control circuit PCC cuts off the plate driving signal PDS. In this case, the output OUT is deactivated to be logically low irrespectively of the logic of the plate driving signal PDS.

If the output OUT is activated to be logically high, the plate line driver PLD drives the plate line PL to be logically high. If the output OUT is deactivated to be logically low, the plate line driver PLD drives the plate line PL to be logically low.

"To activate" means to turn on or drive an element or a circuit and "to deactivate" means to turn off or stop the element or the circuit. Accordingly, a HIGH (high-potential level) signal is an activation signal on one occasion and a LOW (low-potential level) signal is an activation signal on another occasion. For example, an NMOS transistor is activated by setting a gate thereof HIGH. A PMOS transistor is activated by setting a gate thereof LOW.

Figure 3:
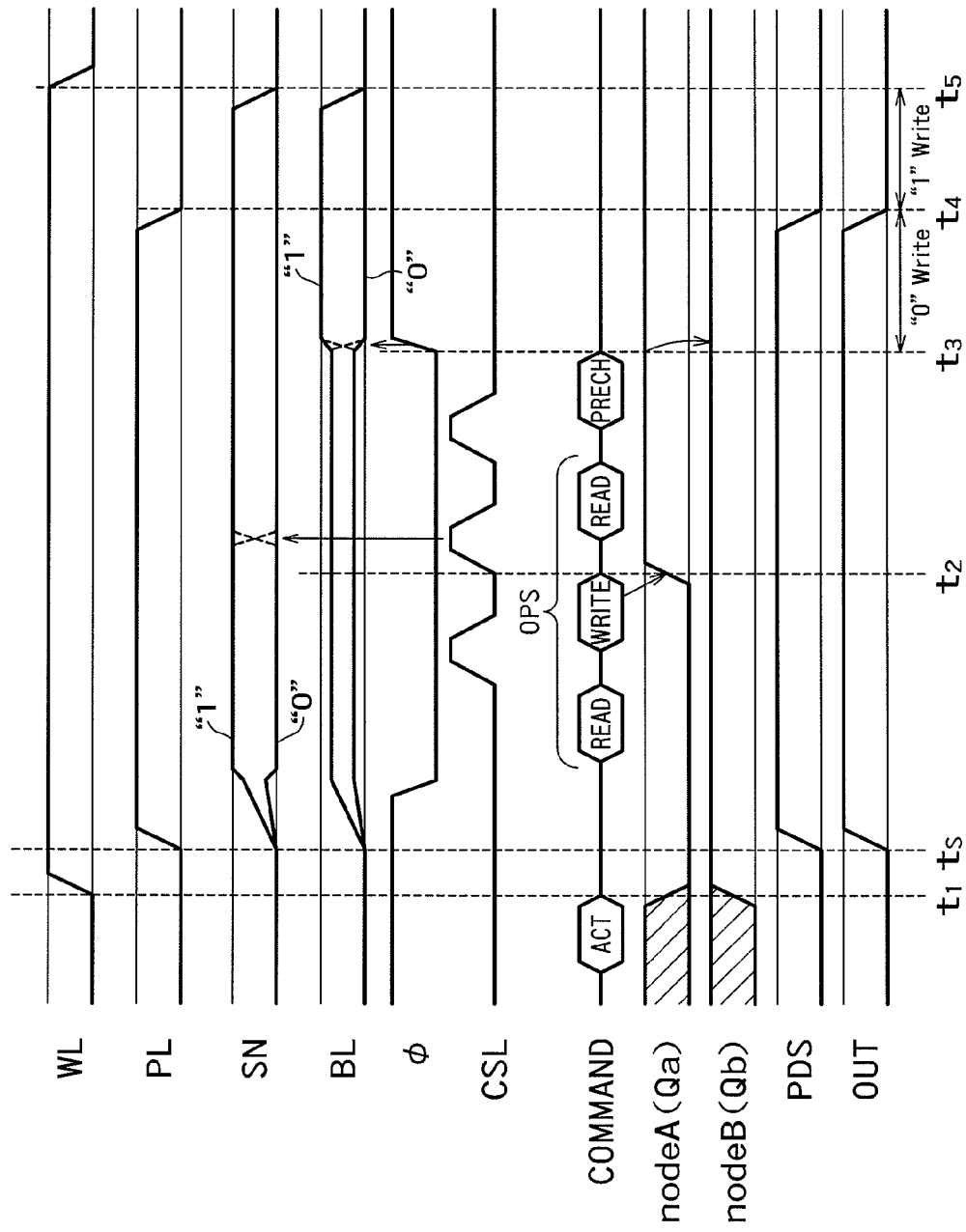
FIG. 3 and FIG. 4 are timing diagrams showing the data write operation and/or the data read operation.
Figure 4:
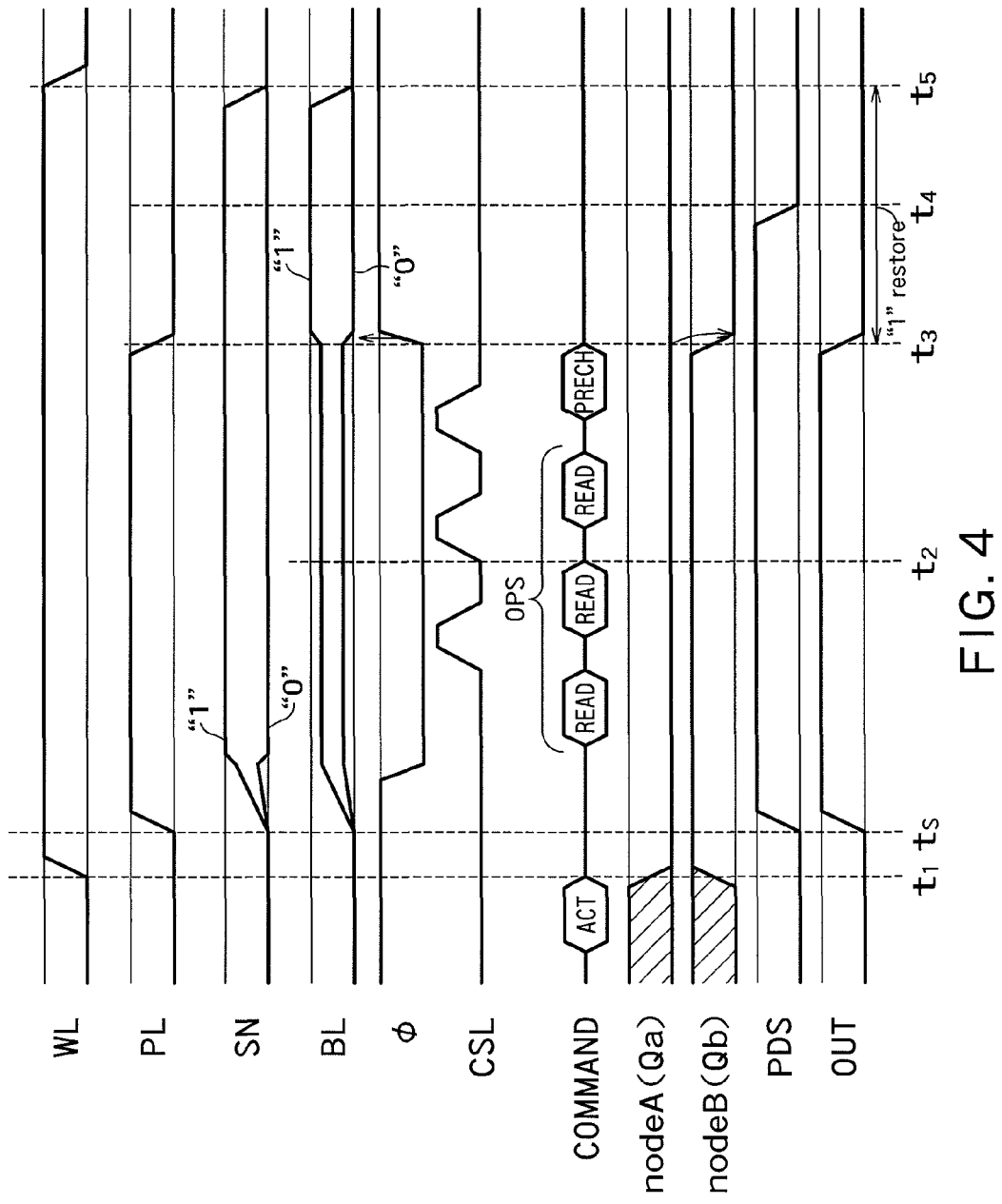

FIG. 3 and FIG. 4 are timing diagrams showing the data write operation and/or the data read operation. An operation performed by the ferroelectric memory device according to the first embodiment will be described in more detail with reference to FIGS. 3 and 4.

In the first embodiment, a plurality of data read operations and/or a plurality of data write operations are executed in one executable period from activation of the active signal ACT to activation of the precharge signal PRECH. In this case, the data read operation is an operation for outputting data latched by the sense amplifier S/A from the input/output circuit I/O. The data write operation is an operation for writing data from the input/output circuit I/O to the sense amplifier S/A. After the data read or data write operation, the sense amplifier S/A writes (restores) the latched data to the memory cell MC. An operation for executing a plurality of data read operations and/or a plurality of data write operations in the executable period and then for writing the latched data by the sense amplifier S/A to the memory cell MC as stated above is referred to as "burst mode".

FIG. 3 shows a burst mode including at least one data write operation in one executable period. FIG. 4 shows a burst mode in which the data write operation is not included in a certain executable period but in which only data read operations are included therein.

When the active signal ACT is activated (at t1), only a selected word line WL is activated to be logically high. The executable period thereby starts. The operation flag Qa at a node A is reset to be logically low and the operation flag Qb at a node B is set to be logically high.

When the plate driving signal PDS is activated to be logically high (at ts), the plate line PL as well as the output OUT is activated to be logically high. At this moment, the operation flag Qb is active, so that the plate control circuit PCC validates the plate driving signal PDS. Simultaneously with this validation, an initial sense operation starts. If data is developed on the bit line BL, the control signal Φ is deactivated and the sense amplifier S/A is disconnected from the bit line BL. Right after disconnection of the sense amplifier S/A from the bit line BL, the sense amplifier S/A amplifies the signal difference between the data "0" and the data "1".

Thereafter, the column selection line CSL is activated for every data read operation or every data write operation. As a result, in the data read operation (READ), the data is read from the sense amplifier S/A to the outside via the input/output circuit I/O shown in FIG. 1. In the data write operation (WRITE), the data is written from the outside to the sense amplifier S/A via the input/output circuit I/O. At this time, the sense node SN is updated by the write data.

A sequence shown in FIG. 3 includes the data write operation. Accordingly, the first flip-flop FF1 activates the operation flag Qa at the node A to be logically high if the write signal WRITE is activated. The first flip-flop FF1 keeps a logically high state of the operation flag Qa until the state is reset in a next sequence. The second flip-flop FF2 sets the operation flag Qb at the node B equal in logic to the operation flag Qa if the precharge signal PRECH is activated. A logical state of the operation flag Qb is kept until a next set (next activation of the active signal ACT). Accordingly, the gate G1 validates the plate driving signal PDS from activation of the precharge signal PRECH to next activation of the active signal ACT.

At t3, the control signal Φ is activated. The transfer gate TG shown in FIG. 1 thereby connects the bit line BL to the sense amplifier S/A. Accordingly, the data latched by the sense amplifier S/A in each column is written to each memory cell MC via the bit line BL. From the t3 to t4, the data "0" is written to the memory cell MC. From the t4 to t5, the data "1" is written to the memory cell MC.

In this way, if the data write operation for writing data from the outside to the sense amplifier S/A is included in the executable period, the plate control circuit PCC validates the plate control signal PDS even after activation of the precharge signal PRECH. As a result, a period for writing data to the memory cell MC can be equally provided for each of the data "1" and the data "0" and both the data "1" and the data "0" can be sufficiently written to the memory cells MC.

A broken line on the bit line BL shown in FIG. 3 indicates an instance in which the data read from each memory cell MC is logically opposite to the data written from the outside in a certain column. In this column, a potential of the sense node SN is inverted when data is written to the sense amplifier S/A. A potential of the bit line BL is inverted when data is written to the memory cell MC. In other columns, the sense nodes SN and the bit lines BL restore data equal in logic to the data read from the memory cells MC.

A sequence shown in FIG. 4 does not include the data write operation (WRITE) but includes only the data read operations (READ). That is, the write signal WRITE is never activated in the sequence shown in FIG. 4. Accordingly, after the t1, the first flip-flop FF1 keeps the operation flag Qa at the node A to be inactive (logically low). Thereafter, that is, right after activation of the precharge signal PRECH, the second flip-flop FF2 sets the operation flag Qb at the node B to be equal in logic to the operation flag Qa. The logical state of the operation flag Qb is kept until next activation of the active signal ACT. Accordingly, the gate G1 invalidates the plate driving signal PDS in a period from activation of the precharge signal PRECH to the next activation of the active signal ACT.

By doing so, if the executable period includes only the data read operations, the plate control circuit PCC invalidates the plate driving signal PDS at time of activating the precharge signal PRECH (at end of the executable period). Accordingly, after activation of the precharge signal PRECH, the output OUT is deactivated to be logically low irrespectively of the plate driving signal PDS. As a result, a restore period for undestroyed data (for example, "0") can be allocated to a restore period for destroyed data (for example, "1").

For example, at an initial period of data detection, the bit line BL is set to be logically low and the plate line PL is set to be logically high, thereby applying voltage to the ferroelectric capacitor FC. Electric charges (charges) according to the data stored in the ferroelectric capacitor FC are thereby emitted to the bit line BL and the potential of the bit line BL rises. At this time, as shown in FIG. 4, it is assumed that the potential of the bit line BL is high if the data is "1", and that the potential of the bit line BL is low if the data is "0". In this case, since the plate line PL is set to be logically high, the data "1" is destroyed. At the time (t3) of activating the precharge signal PRECH, the plate line PL is changed to be logically low. At the same time, the bit line BL transmitting the data "1" is changed to be logically high. Accordingly, only the data "1" is restored due to a potential difference between the bit line BL (logically high) transmitting the data "1" and the plate line PL (logically low). Since no potential difference is generated between the bit line BL (logically low) transmitting the data "0" and the plate line PL (logically low), the data "0" is retained.

In the first embodiment, if the executable period does not include the data write operation, the unnecessary restore period for data "0" can be allocated to the restore period for the data "1". Polarization of a ferroelectric does not always occur instantly at the time of applying voltage but it takes some time after applying the voltage. Magnitude of the polarization is determined by write time. Accordingly, polarization characteristics of the ferroelectric capacitor FC storing therein the data "1" can be improved by lengthening the write time for writing the data "1" to be destroyed. It is thereby possible to ensure writing (restoring) the destroyed data "1" to the memory cell MC. As a result, the signal difference between the data "1" and the data "0" can be increased, contributing to improvement of reliability.

Except for a special example like a third embodiment of the present invention described later, it is generally not clear whether one sequence includes the data write operation for writing data from the outside to the sense amplifier S/A until the precharge signal PRECH indicating the end of the sequence is activated. Therefore, as shown in FIG. 4, the data "1" starts to be restored right after the precharge signal PRECH is activated, whereby restore time for the data "1" destroyed in the data read operation can be lengthened to the maximum.

Second Embodiment

Figure 5:
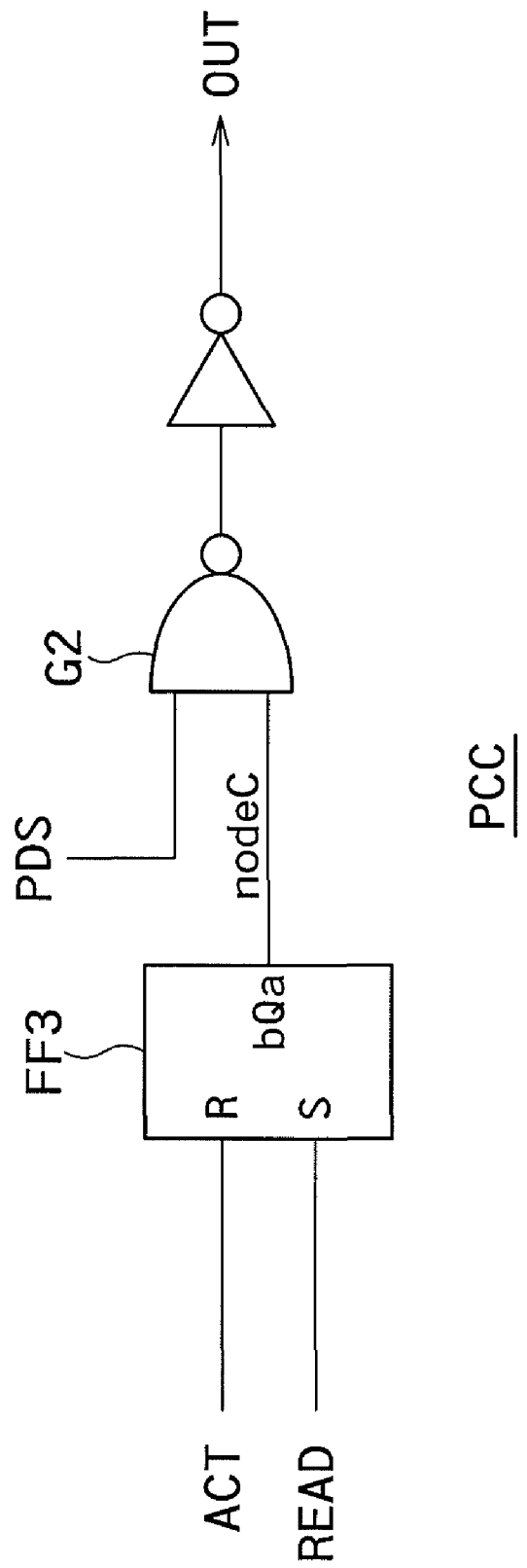
FIG. 5 is a circuit diagram showing a configuration of a plate control circuit PCC according to a second embodiment of the present invention.

FIG. 5 is a circuit diagram showing a configuration of a plate control circuit PCC according to a second embodiment of the present invention. A basic configuration of a ferroelectric memory according to the second embodiment can be identical to that of the ferroelectric memory shown in FIG. 1.

Figure 6:
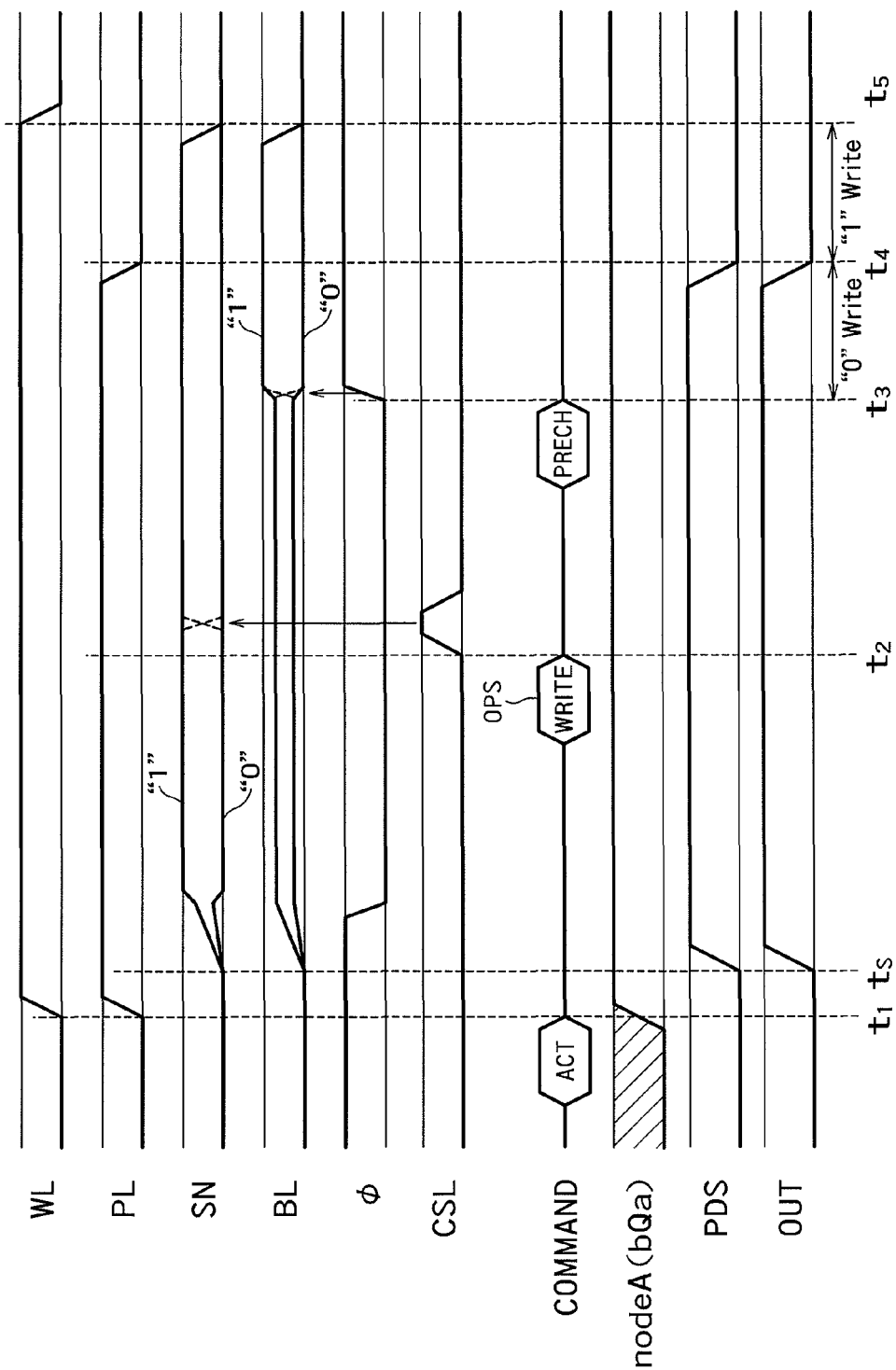
FIG. 6 and FIG. 7 are timing diagrams showing the data write operation and/or the data read operation according to the second embodiment.
Figure 7:
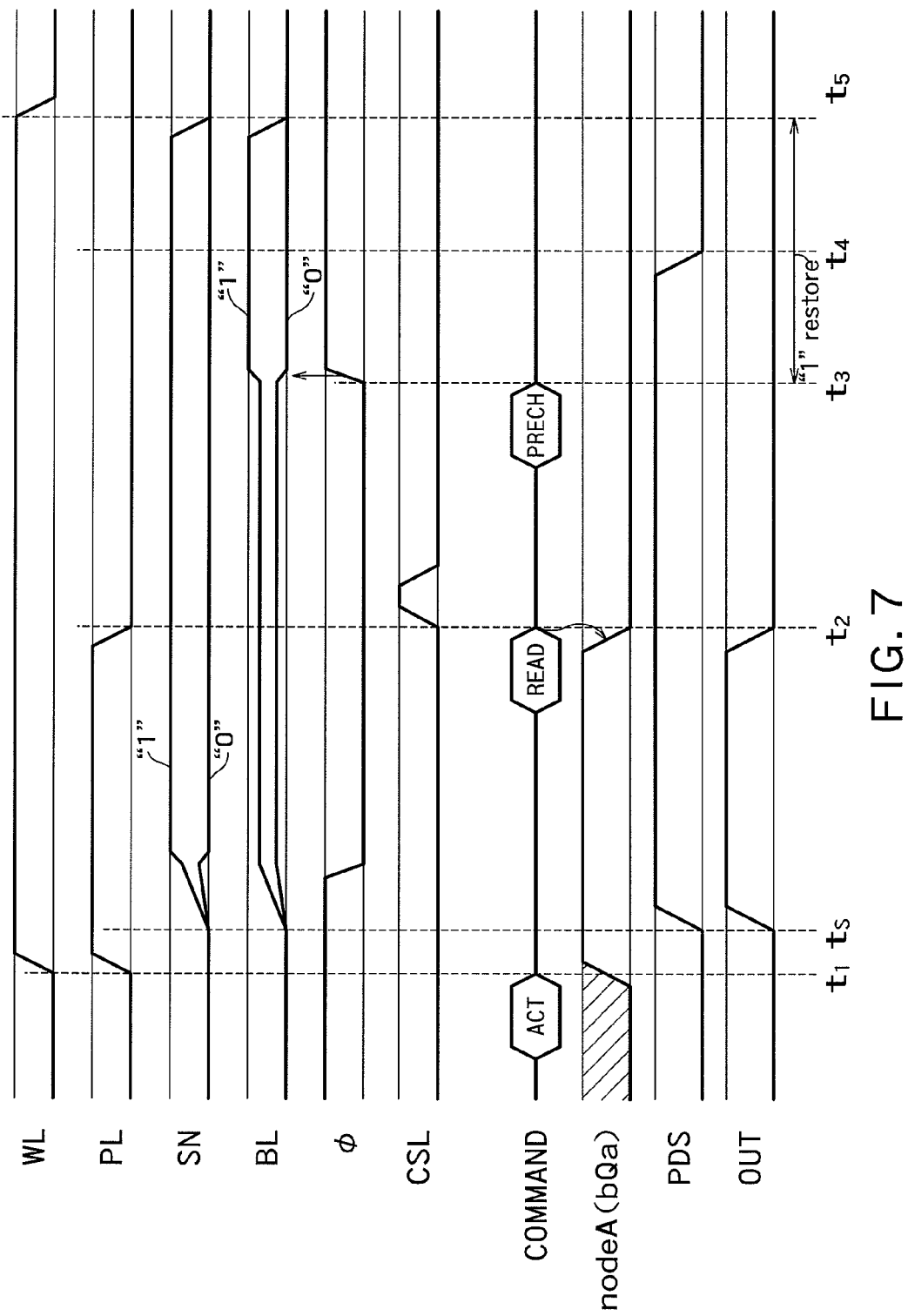

In the second embodiment, only a data write operation (WRITE) or a data read operation (READ) is executed in an executable period. As shown in FIG. 6, if the data write operation (WRITE) for writing data from an outside to a sense amplifier S/A (a read signal READ is logically low) is executed, writing of data "0" and data "1" to memory cells MC is equally executed as usual. As shown in FIG. 7, if the data read operation READ for reading data from the sense amplifier S/A to the outside (the read signal READ is logically high) is executed, only restoring of data "1" is executed.

As shown in FIG. 5, the plate control circuit PCC is configured to receive a plate driving signal PDS and the read signal READ, and to validate or invalidate the plate driving signal PDS based on the read signal READ. The plate control signal PCC includes a flip-flop FF3 and a gate circuit G2.

The flip-flop FF3 receives an active signal ACT as a reset input, receives the read signal READ as a set input, and determines and holds a state of an operation flag bQa based on the active signal ACT and the read signal READ. As indicated by t1 shown in FIG. 6, the operation flag bQa is reset to be logically high by the active signal ACT. If the read signal READ is logically low, the flip-flop FF3 keeps the operation flag bQa to be logically high. As shown in FIG. 7, if the read signal READ is logically high, the flip-flop FF3 sets the operation flag bQa to be logically low.

The gate circuit G2 receives the operation flag bQa from the flip-flop FF3 via a node C, and also receives the plate driving signal PDS. The gate circuit G2 validates or invalidates the plate driving signal PDS according to the operation flag bQa.

For example, as shown in FIG. 6, if the read signal READ is logically low, the operation flag bQa is active (logically high). Therefore, the gate circuit G2 validates the plate driving signal PDS and passes through the valid driving signal PDS. As shown in FIG. 7, if the read signal READ is logically high, the operation flag bQa is inactive (logically low) after t2. Therefore, the gate circuit G2 invalidates the plate driving signal PDS after the t2. Other configurations of the second embodiment can be identical to corresponding configurations of the first embodiment.

FIG. 6 and FIG. 7 are timing diagrams showing the data write operation and/or the data read operation according to the second embodiment.

As indicated by t2 to t5 shown in FIG. 6, after end of the data write operation for writing data from the outside to the sense amplifier S/A, the plate control circuit PCC keeps the plate driving signal PDS to be valid. Accordingly, the plate line PL is driven according to the plate driving signal PDS. As a result, similarly to the operation from the t3 to the t5 shown in FIG. 3, a write period for writing data "0" and a write period for writing data "1" are equally executed after activating the precharge signal PRECH.

In the data read operation, as indicated by t2 to t5 shown in FIG. 7, the plate control circuit PCC invalidates the plate driving signal PCC after end of the data read operation for reading data from the sense amplifier S/A to the outside. Therefore, the plate line PL is deactivated to be logically low after the t2 irrespectively of the plate driving signal PDS.

Accordingly, similarly to the operation from the t3 to the t5 shown in FIG. 4, the sense amplifier S/A restores only the data "1" to the memory cell MC after activation of the precharge signal PRECH. As a result, a restore period for undestroyed data (for example, data "0") can be allocated to a restore period for destroyed data (for example, data "1"). Other operations of the second embodiment can be identical to those of the first embodiment.

As described in the second embodiment, if the executable period includes only one data write operation or only one data read operation, the plate control circuit PCC can determine whether to validate or invalidate the plate driving signal PDS after end of the data write operation or the data read operation without waiting for activation of the precharge signal PRECH. Therefore, according to the second embodiment, similarly to the first embodiment, restore time for the data "1" destroyed in the data read operation can be lengthened to the maximum.

Third Embodiment

Figure 8:
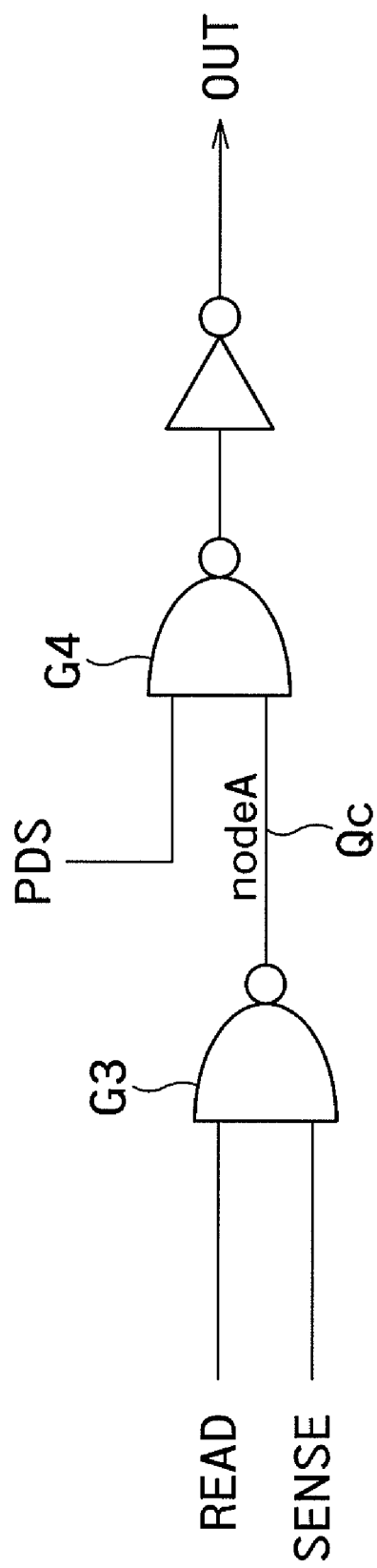
FIG. 8 is a circuit diagram showing a configuration of a plate control circuit PCC according to the third embodiment of the present invention.

FIG. 8 is a circuit diagram showing a configuration of a plate control circuit PCC according to the third embodiment of the present invention. A basic configuration of a ferroelectric memory device according to the third embodiment can be identical to that shown in FIG. 1. In the third embodiment, before an operation starts, it is known whether or not the operation is a data read operation. Therefore, logic of a read signal READ shown in FIG. 8 is determined to be high or low before the operation starts.

For example, if the ferroelectric memory device is employed as a ROM (Read Only Memory), most accesses are made to read data to an outside. Accordingly, the read signal READ is fixed to be logically high in most cases. On the other hand, the data write operation is executed only if data stored in the ferroelectric memory device is to be updated. Accordingly, the read signal READ is set to be logically low only in a data update operation.

As shown in FIG. 8, the plate control circuit PCC includes a gate circuit G3 serving as a first gate circuit and a gate circuit G4 serving as a second gate circuit.

Figure 9:
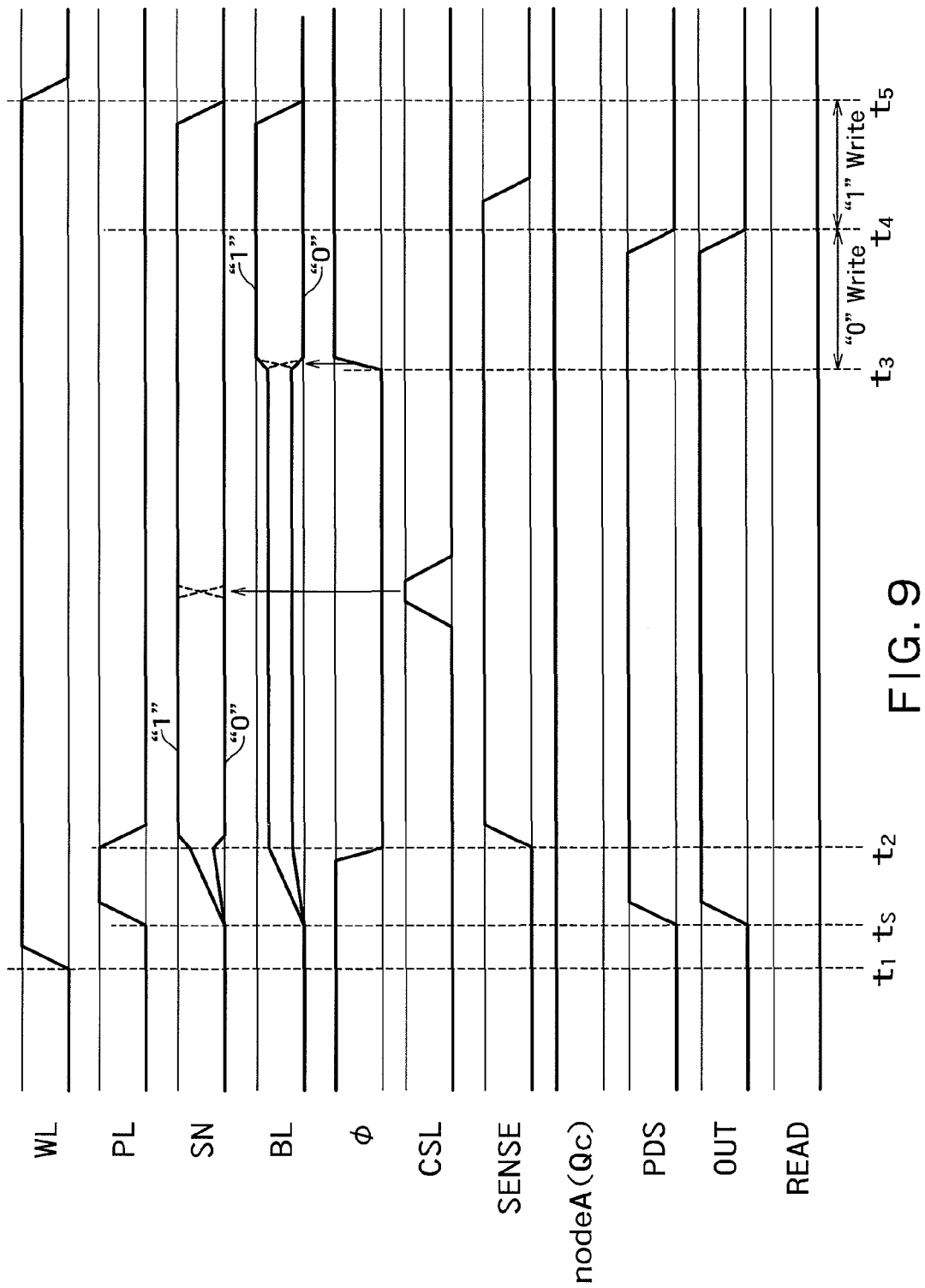
FIG. 9 is a timing diagram showing the data write operation for writing data from the outside to the sense amplifier S/A.
Figure 10:
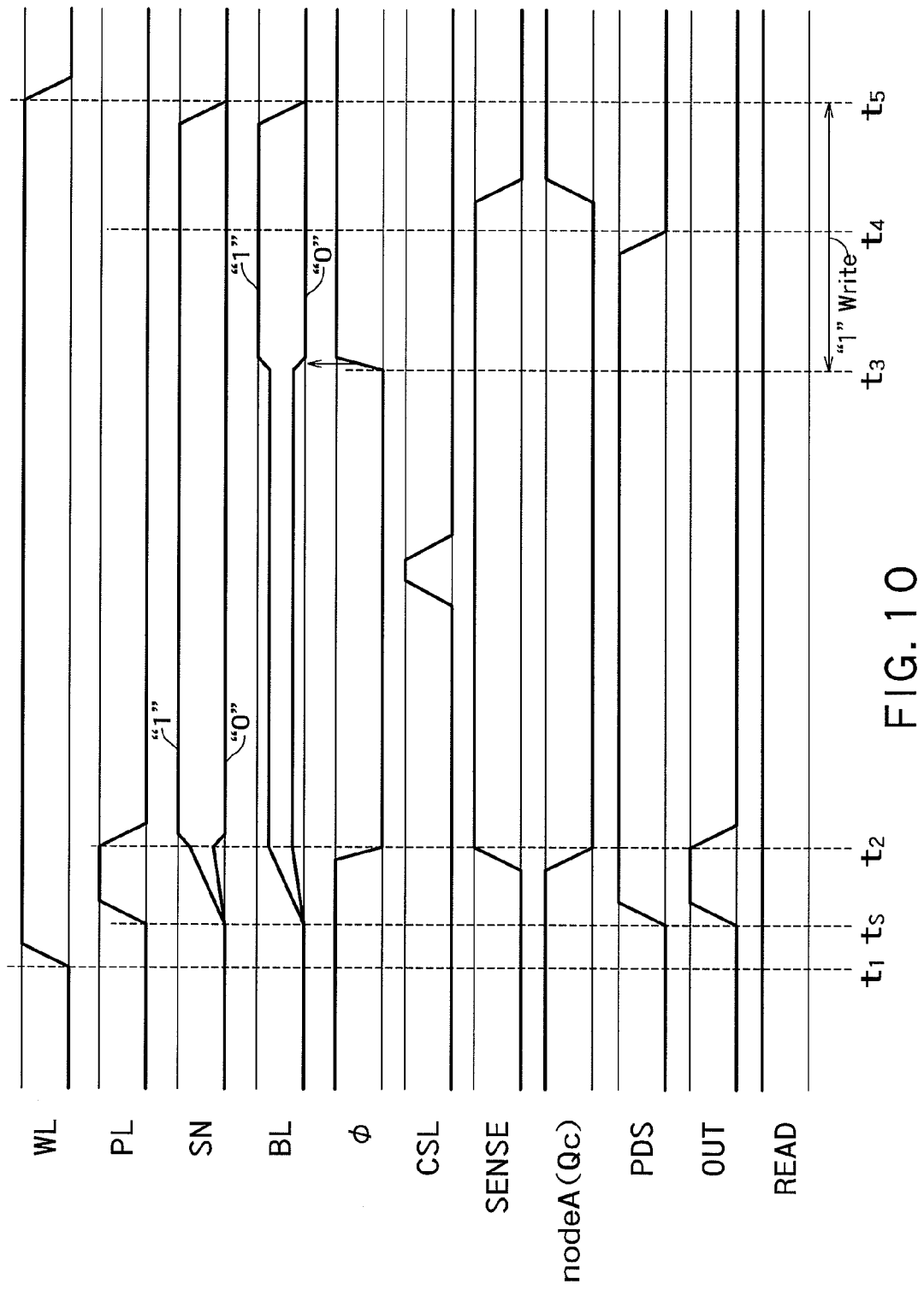
FIG. 10 is a timing diagram showing the data read operation for reading data from the sense amplifier S/A to the outside.

The gate circuit G3 receives the read signal READ indicating the data read operation for reading data from a sense amplifier S/A to an outside, and a sense signal SENSE indicating start of an amplification operation performed by the sense amplifier S/A. The gate circuit G3 outputs an operation flag Qc based on the read signal READ when the sense signal SENSE is activated. As shown in FIG. 9, if the read signal READ is logically low (a data write operation is to be executed), the gate circuit G3 keeps the operation flag Qc to be logically high. As shown in FIG. 10, if the read signal READ is logically high (a data read operation is to be executed), the gate circuit G3 makes the operation flag Qc fall to be logically low.

The gate circuit G4 receives a plate driving signal PDS and the operation flag Qc. The gate circuit G4 invalidates the plate driving signal PDS if the operation flag Qc is logically low, and validates the plate driving signal PDS if the operation flag Qc is logically high.

The plate control circuit PCC can thereby validate or invalidate the plate driving signal PDS based on the read signal READ and the sense signal SENSE.

FIG. 9 is a timing diagram showing the data write operation for writing data from the outside to the sense amplifier S/A. At t1, an executable period starts. At ts, an initial sense operation is started. At t2, the sense signal SENSE is activated and the sense amplifier S/A starts the amplification operation. The sense amplifier S/A thereby amplifies a signal difference between data "0" and data "1".

In FIG. 9, the read signal READ is kept to be logically low. Accordingly, the plate control signal PCC keeps an output OUT according to the plate driving signal PDS. That is, a plate line PL is driven according to the plate driving signal PDS. Therefore, after the executable period, from t3 to t5, writing of data "0" and writing of data "1" are equally executed similarly to the operation from the t3 to the t5 shown in FIGS. 3 and 6.

FIG. 10 is a timing diagram showing the data read operation for reading data from the sense amplifier S/A to the outside. Operations from t1 to t2 are the same as the operations from the t1 to the t2 shown in FIG. 9.

At the t2, the sense signal SENSE is activated and the sense amplifier S/A starts the amplification operation. The sense amplifier S/A thereby amplifies the signal difference between the data "0" and the data "1".

In FIG. 10, the read signal READ is kept to be logically high. Therefore, the plate control circuit PCC deactivates the output OUT to be logically low irrespectively of logic of the plate driving signal PDS. That is, the plate line PL is deactivated to be logically low irrespectively of the logic of the plate driving signal PDS. At the t2, a control signal Φ is deactivated and a transfer gate TG disconnects a bit line BL from the sense amplifier S/A. Due to this, even if the plate line PL is set to be logically low, the data detected by the sense amplifier S/A is not influenced by the setting.

From t3 to t5, after the executable period ends, the sense amplifier S/A restores only the data "1" to the memory cell MC similarly to the operation from the t3 to the t5 shown in FIGS. 4 and 7. Thus, the third embodiment can achieve effects identical to those of the first embodiment.

In the first embodiment, the activation of the precharge signal PRECH serves as a trigger to start writing (or restoring) data from the sense amplifier S/A to the memory cell MC. Alternatively, activation of the control signal Φ can be used as a trigger in place of the activation of the precharge signal PRECH to start writing (or restoring) data from the sense amplifier S/A to the memory cell MC. Further, in the second and the third embodiments, activation of the control signal Φ also can be used as a trigger in place of the activation of the precharge signal PRECH to start writing (or restoring) data from the sense amplifier S/A to the memory cell MC.

Figure 11:
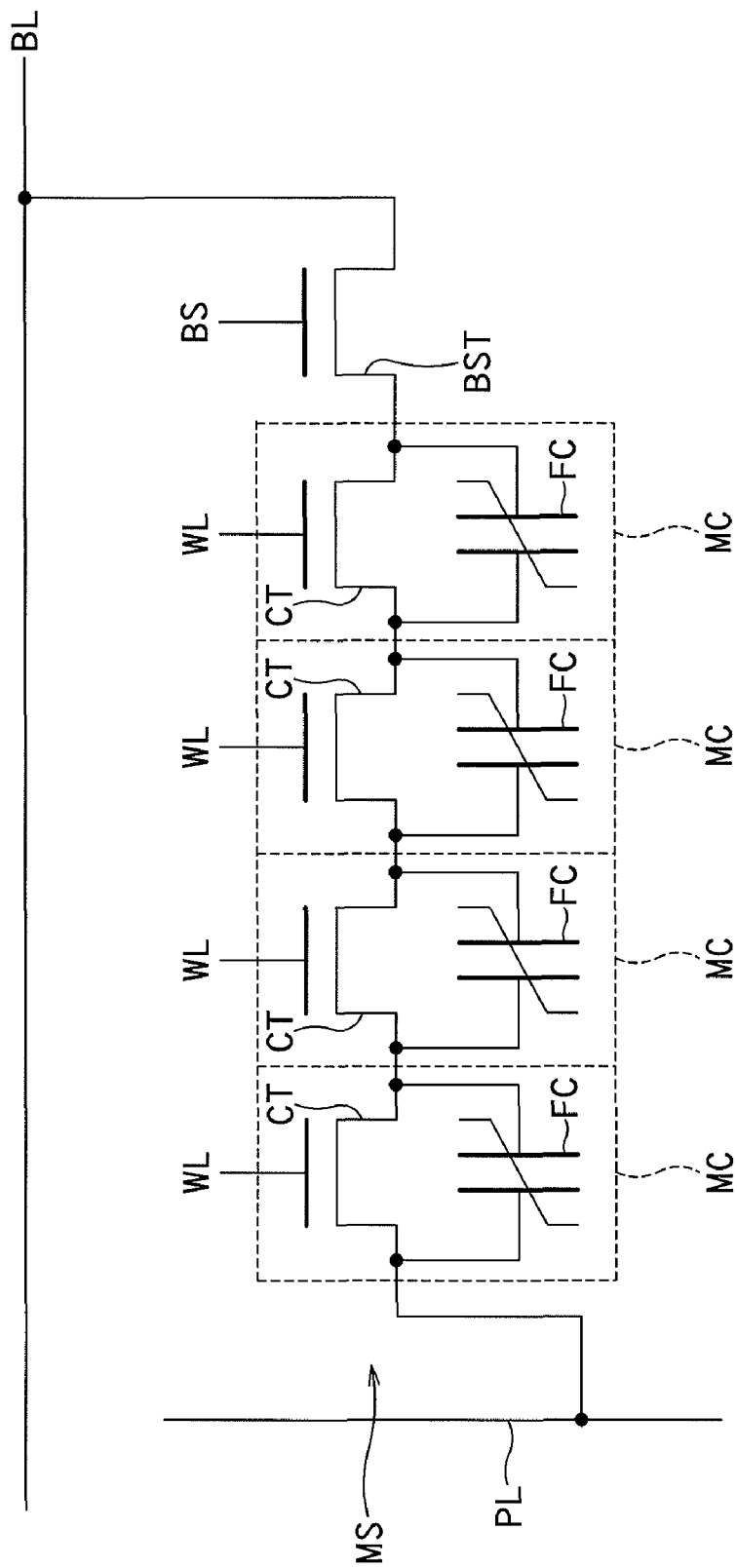
FIG. 11 is a circuit diagram showing a configuration of a Series connected TC unit type ferroelectric RAM.

It is readily understood that the embodiments can be applied to a Series connected TC unit type ferroelectric RAM as shown in FIG. 11. The Series connected TC unit type ferroelectric RAM is a memory which consists of series connected memory cells each having a transistor having a source terminal and a drain terminal and a ferroelectric capacitor inbetween said two terminals.

The invention claimed is:

1. A semiconductor memory device comprising:
a plurality of word lines;
a plurality of bit lines intersecting the plurality of word lines;
a plurality of ferroelectric capacitors corresponding to intersecting points between the word lines and the bit lines and configured to store therein data;
a plurality of plate lines connected to electrodes of the ferroelectric capacitors;
a plurality of sense amplifiers connected to the bit lines, and configured to detect the data in the ferroelectric capacitors connected the bit lines; and
a plate controller configured to receive a plate driving signal configured to drive at least one of the plate lines, a write signal indicative of writing of data from an outside to at least one of the sense amplifiers, and an operation end signal indicative of end of an executable period for reading the data from at least one of the sense amplifiers to the outside or for writing the data from the outside to at least one of the sense amplifiers, the plate controller being configured to validate or invalidate the plate driving signal on the basis of the write signal and the operation end signal wherein
the plate controller is configured to validate the plate driving signal in the executable period, and
the plate controller is configured to invalidate the plate driving signal at the end of the executable period when the write signal is never activated in the executable period, and to keep the plate driving signal valid when the write signal is activated at least once in the executable period.

2. The device of claim 1, wherein
the plate controller comprises:
a first flip-flop configured to receive the write signal, to determine a state of an operation flag based on the write signal, and to hold the state of the operation flag;
a second flip-flop configured to receive the operation end signal and the operation flag, and to output and hold the operation flag when the operation end signal is activated; and
a gate circuit configured to receive the plate driving signal and the operation flag from the second flip-flop, and to validate or invalidate the plate driving signal according to the operation flag from the second flip-flop.

3. The device of claim 2, wherein the first flip-flop and the second flip-flop are reset or set by an operation start signal indicative of start of the executable period.

4. The device of claim 1, wherein one of the sense amplifiers is configured to write the data to a corresponding ferroelectric capacitor after the end of the executable period.

5. A semiconductor memory device comprising:
a plurality of word lines;
a plurality of bit lines intersecting the plurality of word lines;
a plurality of ferroelectric capacitors corresponding to intersecting points between the word lines and the bit lines, respectively, and configured to store therein data;
a plurality of plate lines connected to electrodes of the ferroelectric capacitors;
a plurality of sense amplifiers connected to the bit lines, and configured to detect the data in the ferroelectric capacitors connected the bit lines; and
a plate controller configured to receive a plate driving signal configured to drive at least one of the plate lines and a read signal indicative of a data read operation for reading data from at least one of the sense amplifiers to an outside, and to validate or invalidate the plate driving signal based on the read signal, wherein
the plate controller is configured to validate the plate driving signal in an executable period for the data read operation for reading the data from at least one of the sense amplifiers to the outside or for a data write operation for writing data from the outside to at least one of the sense amplifiers, and the plate controller is configured to invalidate the plate driving signal when the read signal is activated, and to keep the plate driving signal valid when the read signal is not activated.

6. The device of claim 5, wherein the plate controller comprises:

a flip-flop configured to receive the read signal, to determine a state of an operation flag indicating whether or not the read signal is activated, and to hold the state of the operation flag; and a gate circuit configured to receive the plate driving signal and the operation flag, and to validate or invalidate the plate driving signal according to the state of the operation flag.

7. The device of claim 6, wherein the flip-flop is reset by an operation start signal indicative of start of the data read operation or the data write operation.

8. A semiconductor memory device comprising:

a plurality of word lines;

a plurality of bit lines intersecting the plurality of word lines;

a plurality of ferroelectric capacitors corresponding to intersecting points between the word lines and the bit lines, respectively, and configured to store therein data;

a plurality of plate lines connected to electrodes of the ferroelectric capacitors;

a plurality of sense amplifiers connected to the bit lines, and configured to detect the data in the ferroelectric capacitors connected the bit lines; and a plate controller configured to receive a plate driving signal configured to drive at least one of the plate lines, a read signal indicating a data read operation for reading data from at least one of the sense amplifiers to an outside, and a sense signal indicating start of an amplification operation performed by at least one of the sense amplifiers, and to validate or invalidate the plate driving signal based on the read signal and the sense signal, wherein the plate controller is configured to hold a state of executing the data read operation or a state of not executing the data read operation during an executable period, the executable period being for the data read operation for reading the data from at least one of the sense amplifiers to the outside or for a data write operation for writing data from the outside to at least one of the sense amplifiers, and the plate controller is configured to invalidate the plate driving signal when at least one of the sense amplifiers is activated if the read signal indicates the data read operation, and to keep the plate driving signal valid if the read signal does not indicate the data read operation.

9. The device of claim 8, wherein the plate controller comprises:

a first gate circuit configured to receive the read signal and the sense signal, and to output an operation flag based on the read signal when the sense signal is activated; and a second gate circuit configured to receive the plate driving signal and the operation flag, and to invalidate the plate driving signal when the sense signal is activated in a case that the read signal indicates the data read operation.

* * * * *